(12) United States Patent
Kord et al.

(10) Patent No.: US 12,476,594 B2
(45) Date of Patent: Nov. 18, 2025

(54) WIDEBAND AMPLIFIER

(71) Applicant: QUALCOMM Incorporated, San Diego, CA (US)

(72) Inventors: Ahmed Kord, San Diego, CA (US); Francesco Gatta, San Diego, CA (US); Mehmet Uzunkol, San Diego, CA (US); Bassel Hanafi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 793 days.

(21) Appl. No.: 17/824,802

(22) Filed: May 25, 2022

(65) Prior Publication Data

US 2023/0387868 A1 Nov. 30, 2023

(51) Int. Cl.
  *H03F 9/00* (2006.01)
  *H03F 1/22* (2006.01)
  *H03F 1/56* (2006.01)
  *H03F 3/00* (2006.01)
  *H03F 3/193* (2006.01)
  *H03H 7/38* (2006.01)

(52) U.S. Cl.
  CPC ............ *H03F 1/565* (2013.01); *H03F 1/223* (2013.01); *H03F 3/005* (2013.01); *H03F 3/193* (2013.01); *H03H 7/38* (2013.01); *H03F 2200/222* (2013.01); *H03F 2200/225* (2013.01); *H03F 2200/294* (2013.01); *H03F 2200/318* (2013.01); *H03F 2200/387* (2013.01)

(58) Field of Classification Search
  CPC ....................................... H03F 9/00
  USPC ................................... 330/165, 276
  See application file for complete search history.

(56) References Cited

U.S. PATENT DOCUMENTS

| 6,424,222 B1 | 7/2002 | Jeong et al. |
| 7,202,749 B2 * | 4/2007 | Mohammadi ........... H03F 1/223 330/307 |
| 8,421,533 B2 * | 4/2013 | Sun ....................... H04L 27/368 330/149 |

(Continued)

FOREIGN PATENT DOCUMENTS

| CN | 112087206 A | 12/2020 |
| CN | 113630147 A | 11/2021 |

OTHER PUBLICATIONS

Lo Y-T., et al., "Design of Wideband LNAs Using Parallel-to-Series Resonant Matching Network Between Common-Gate and Common-Source Stages", IEEE Transactions on Microwave Theory and Techniques, vol. 59, No. 9, Sep. 2011, pp. 2285-2294.

(Continued)

*Primary Examiner* — Henry Choe
(74) *Attorney, Agent, or Firm* — Loza & Loza LLP

(57) ABSTRACT

A wideband amplifier includes an input matching network for matching a transconductor stage to an input impedance and includes an output matching network for matching the transconductor stage to an output impedance. Both the input and output matching networks each includes a parallel LC tank circuit arranged in parallel with a series LC tank circuit. The tank circuit arrangements configure the input and output matching networks to be resonant at a first frequency, a midrange frequency that is greater than the first frequency, and a second frequency that is greater than the midrange frequency to provide wideband matching.

36 Claims, 11 Drawing Sheets

(56) References Cited

U.S. PATENT DOCUMENTS

| | | | |
|---|---|---|---|
| 10,530,314 | B2 | 1/2020 | Medra et al. |
| 10,707,817 | B2 * | 7/2020 | Huang ................... H04B 1/16 |
| 2016/0043698 | A1 | 2/2016 | Banerjee et al. |
| 2017/0187337 | A1 | 6/2017 | Dupuy et al. |
| 2019/0074862 | A1 | 3/2019 | Wang et al. |
| 2019/0372533 | A1 | 12/2019 | Huang et al. |
| 2020/0403582 | A1 | 12/2020 | Takenaka et al. |

OTHER PUBLICATIONS

International Search Report and Written Opinion—PCT/US2023/020492—ISA/EPO—Aug. 11, 2023.

Oza Shruti., et al., "An UWB CMOS LNA: Comparative Analysis of Various LNA Topologies", Proceedings of the National Conference on PEPCCI-2012, Jan. 9, 2012, pp. 98-164, XP093068694, ISBN: 9789381286067, p. 101, Left-Hand Column, Line 11—p. 103, Left-Hand Column, Line 14, Figures 4(a),4(b) ,5.

Zhang Zhong., et al., "A Configurable Multi-band GNSS Receiver for Compass/GPS/Galileo Applications", Circuits and Systems (ISCAS), 2013 IEEE International Symposium on, IEEE, May 19, 2013, pp. 161-164, XP032445882, ISBN: 978-1-4673-5760-9, p. 161, Left-Hand Column, Line 13—p. 162, Right-Hand Column, Line 34, figures 1,2.

* cited by examiner

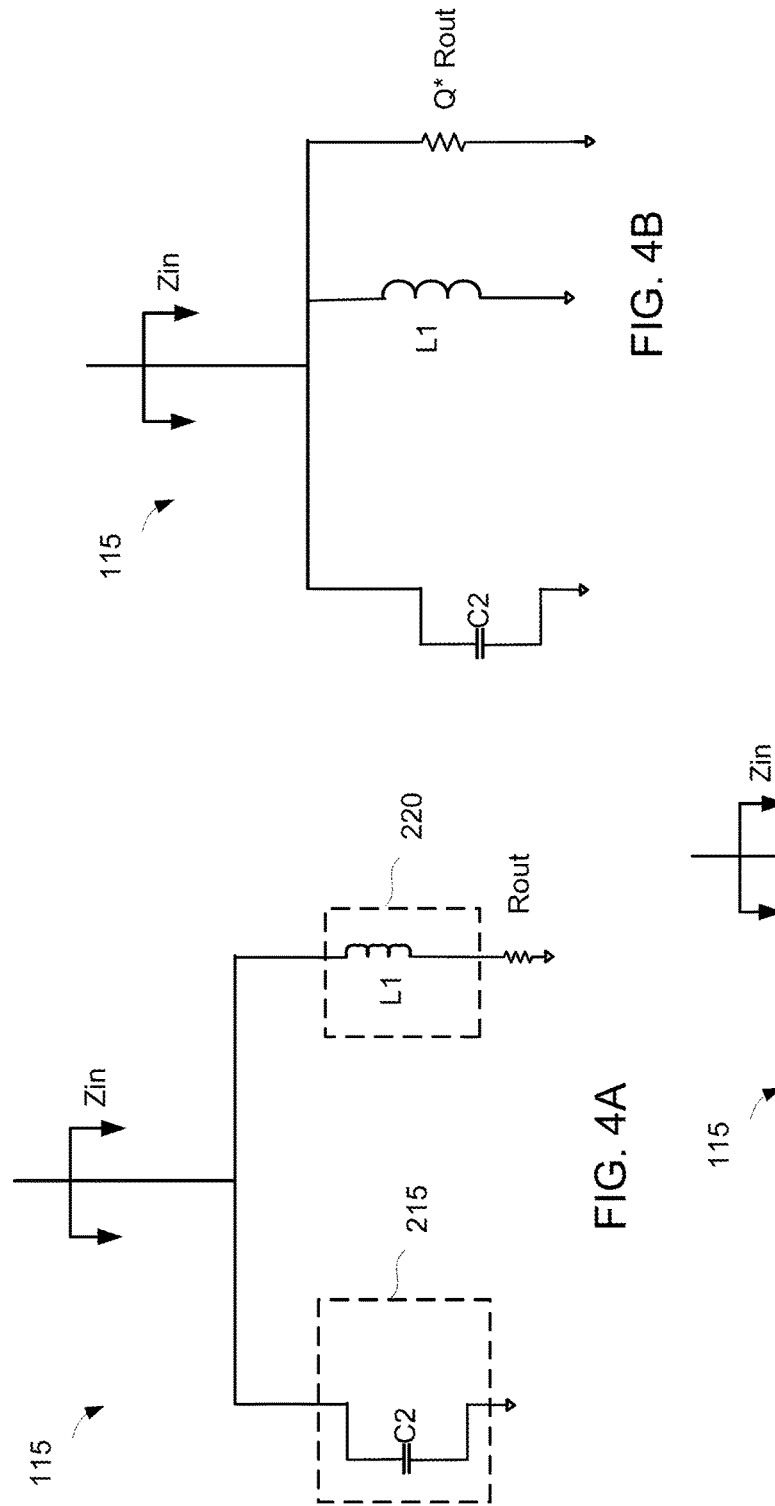

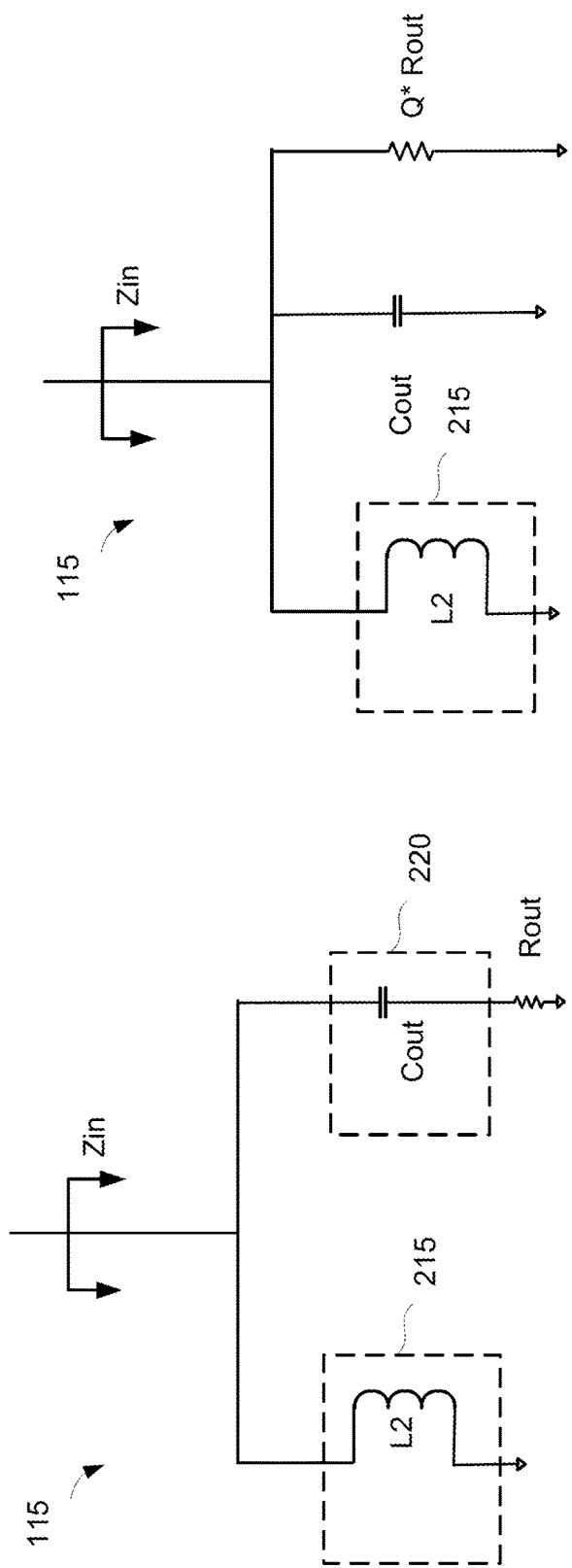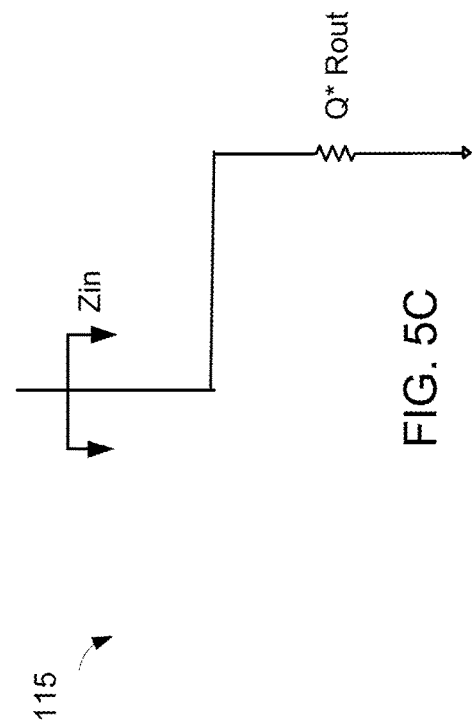
FIG. 5A
FIG. 5B
FIG. 5C transconducting a first input voltage signal through a transconductor stage having an output capacitance to form a first output current signal at an output node of the transconductor stage ——1000 driving the first output current signal into a parallel combination of a series inductor-capacitor tank circuit and a first parallel inductor-capacitor tank circuit, wherein the series inductor-capacitor tank circuit includes the output capacitance and an inductor coupled between a first coil of an output transformer and an output node of the transconductor stage and the first parallel inductor-capacitor tank circuit includes a capacitor arranged in parallel with the first coil of the output transformer, to cause both the series inductor-capacitor tank circuit and the first parallel inductor-capacitor tank circuit to be resonant at a midrange frequency to match an impedance of an amplifier output node at the midrange frequency to an output resistance of the transconductor stage, wherein the midrange frequency is greater than a first frequency and less than a second frequency ——1005

FIG. 10

WIDEBAND AMPLIFIER

TECHNICAL FIELD

This application relates to amplifiers, and more particularly to a wideband amplifier.

BACKGROUND

Wireless communication devices and technologies are becoming ever more prevalent. Wireless communication devices generally transmit and receive communication signals. A communication signal is typically processed by a variety of different components and circuits such as a transceiver and one or more radio frequency frontend (RFFE) components/circuits. Some wireless communication devices may be configured to operate on a variety of different communication bands. For example, a modern wireless communication device may be configured to operate on radio spectrum covering both 5G and 4G LTE frequencies. In some instances, a modern wireless communication device may be configured to operate simultaneously on 5G and 4G LTE frequencies in what can be referred to as carrier aggregation (CA) in which a wireless communication device may simultaneously communicate over multiple carriers.

To transmit over multiple frequency bands, a wireless communication device may include an amplifier for each frequency band. But the inclusion of an amplifier for each frequency band increases complexity, cost, and power consumption.

SUMMARY

An amplifier is disclosed that includes: a transconductor stage including a transconductor stage output node, the transconductor stage being configured to amplify an input signal; and an output matching network including: a first inductor having a first terminal coupled to the transconductor stage output node; an output transformer including a first coil electromagnetically coupled to a second coil, the first coil being coupled between a reference voltage node and a second terminal of the first inductor, the second coil being coupled to an amplifier output node; and a first capacitor coupled between the second terminal of the first inductor and the reference voltage node.

In addition, an amplification method is disclosed that includes: transconducting a first input voltage signal through a transconductor stage having an output capacitance to form a first output current signal at an output node of the transconductor stage; and driving the first output current signal into a parallel combination of a series inductor-capacitor tank circuit and a first parallel inductor-capacitor tank circuit, wherein the series inductor-capacitor tank circuit includes the output capacitance and an inductor coupled between a first coil of an output transformer and an output node of the transconductor stage and the first parallel inductor-capacitor tank circuit includes a capacitor arranged in parallel with the first coil of the output transformer, to cause both the series inductor-capacitor tank circuit and the first parallel inductor-capacitor tank circuit to be resonant at a midrange frequency to match an impedance of an amplifier output node at the midrange frequency to an output resistance of the transconductor stage, wherein the midrange frequency is greater than a first frequency and less than a second frequency.

Moreover, an amplifier is disclosed that includes: a transconductor stage including a first transconductor transistor; and an input matching network including a first inductor coupled between an amplifier input node and ground, a second inductor having a first terminal coupled to the amplifier input node, a capacitor coupled between a second terminal of the second inductor and a gate of the first transconductor transistor, and a degeneration inductor coupled to a source of the first transconductor transistor, wherein a combination of an inductance of the second inductor, an inductance of the degeneration inductor, and a parasitic gate-to-source capacitance of the first transconductor transistor is configured to form a series inductor-capacitor (LC) tank circuit that is resonant at a first frequency, and wherein a combination of a capacitance of the amplifier input node and an inductance of the first inductor is configured to form a parallel LC tank circuit that is resonant at the first frequency.

Finally, an amplifier is provided that includes: a transconductor stage including a transconductor stage output node; and an output matching network coupled to the transconductor stage output node and including a parallel inductor-capacitor tank circuit arranged in parallel with a series inductor-capacitor tank circuit.

These and other advantageous features may be better appreciated through the following detailed description.

BRIEF DESCRIPTION OF THE DRAWINGS

FIG. 4A is a simplified circuit diagram of an output matching network illustrating its effective impedance as the input signal frequency is increased above the midrange frequency in accordance with an aspect of the disclosure.

FIG. 4B illustrates an equivalent rearrangement of the components of the output matching network of FIG. 4A illustrating its effective impedance as the input signal frequency is increased above the midrange frequency in accordance with an aspect of the disclosure.

FIG. 4C is a simplified circuit diagram of the output network matching network of FIG. 4A illustrating its effective impedance when the output networking matching network is resonant at a higher frequency than the midrange frequency in accordance with an aspect of the disclosure.

FIG. 5A is a simplified circuit diagram of an output matching network illustrating its effective impedance as the input signal frequency is decreased below the midrange frequency in accordance with an aspect of the disclosure.

FIG. 5B illustrates an equivalent rearrangement of the components of the output matching network of FIG. 5A illustrating its effective impedance as the input signal frequency is decreased below the midrange frequency in accordance with an aspect of the disclosure.

FIG. 5C is a simplified circuit diagram of the output network matching network of FIG. 5A illustrating its effective impedance when the output networking matching network is resonant at a lower frequency than the midrange frequency in accordance with an aspect of the disclosure.

FIG. 10 is a flowchart for an example amplification method in accordance with an aspect of the disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

To provide wideband performance, a radio frequency frontend (RFFE) may include two or more low noise amplifiers (LNAs) to cover a relatively wideband that includes two or more sub-bands. For example, an RFFE that covers a wideband from 3.3 GHz to 5 GHz would include at least two LNAs, each LNA being tuned for a particular sub-band within the wideband. The inclusion of multiple LNAs increases power consumption and complexity.

A wideband LNA is disclosed that may replace multiple LNAs and thus save power and die space. The wideband LNA may have an input matching network, a transconductor stage, and an output matching network. Both the input and output matching networks are passive. The transconductor stage includes at least one transconductor transistor having a gate driven by the input matching network. To advantageously enhance impedance matching over a wideband, the output matching network may include a parallel inductor-capacitor (LC) tank circuit arranged in parallel with a series LC tank circuit. As will be explained further herein, the L and C parameters are chosen so the matching output network is resonant at three frequencies: a lower frequency f1, a midrange frequency f0, and a higher frequency f2, where f1<f0<f2. In one example implementation, the lower frequency f1 may be approximately 3.3 GHz, the midrange frequency f0 may be approximately 4.15 GHz, and the upper frequency f2 may be approximately 5 GHz. The result is an advantageous wideband output matching across at least 2 GHz of bandwidth. It will be appreciated, however, that the wideband matching properties disclosed herein are also applicable to other frequency bands. While the output network described herein may provide the advantageous wideband output matching regardless of the particular input matching network implementation (of which a variety may be possible), in some embodiments, the input matching network may also include a parallel inductor-capacitor (LC) tank circuit arranged in parallel with a series LC tank circuit that is similarly resonant at each of the lower frequency f1, the midrange frequency f0, and the higher frequency f2.

Figure 1:
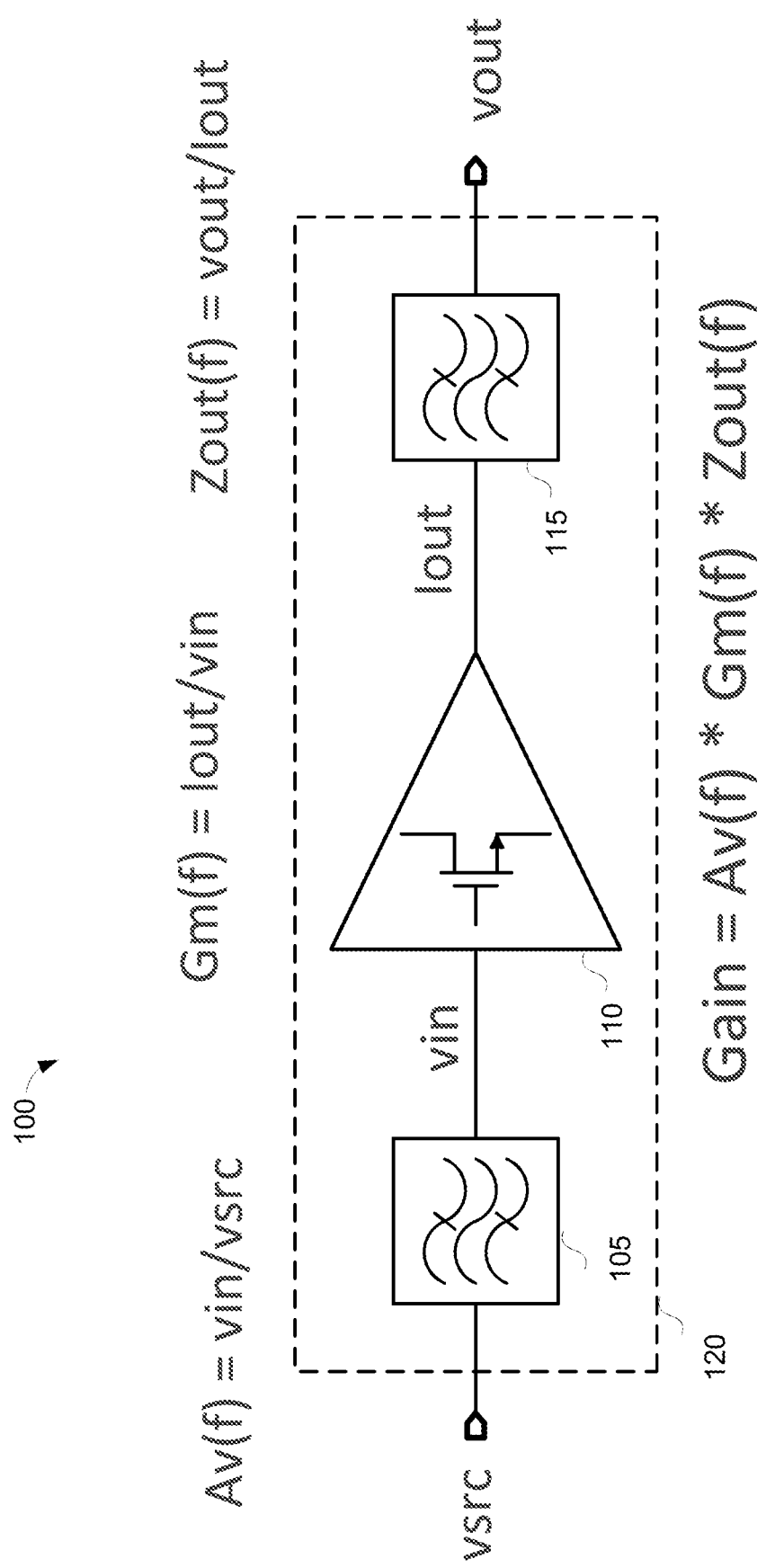
FIG. 1 is a diagram of a wideband amplifier in accordance with an aspect of the disclosure.

The following discussion will address an example wideband LNA, but it will be appreciated that any suitable amplifier may benefit from the wideband matching disclosed herein. An example wideband LNA 100 is shown in FIG. 1. An input matching network 105 receives an RF input signal having a voltage vsrc and outputs an input voltage vin to a transconductor stage 110. Depending upon its impedance, input matching network 105 functions to divide the voltage vsrc to form the input voltage vin according to a function Av(f) of frequency, where Av(f) equals a ratio of vin/vsrc. Transconductor stage 110 converts the input voltage vin into an output current Iout depending upon a frequency-dependent transconductance Gm(f) that equals a ratio of Iout/vin. An output matching network 115 converts the output current Iout into an output voltage vout according to a frequency-dependent output impedance Zout(f) that equals a ratio of vout/Iout. The overall gain of wideband LNA 100 is thus equal to a product of Av(f)*Gm(f)*Zout(f). The following discussion details how the bandwidth output matching network 115 is advantageously increased due to the use of a parallel LC tank circuit that is arranged in parallel with a series LC tank circuit.

Figure 2A:
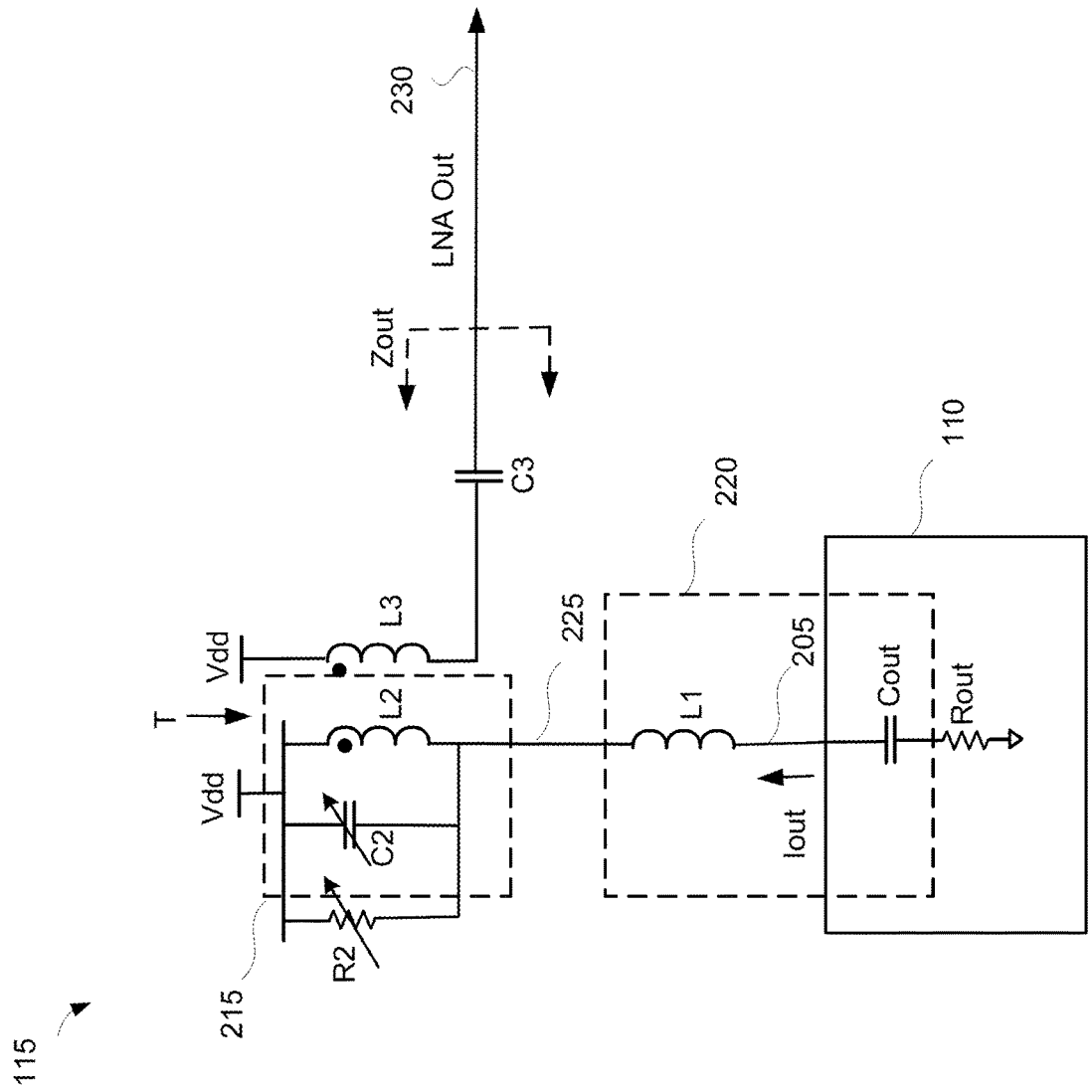
FIG. 2A is a circuit diagram of an output matching network of a wideband amplifier in accordance with an aspect of the disclosure.

Output matching network 115 is shown in more detail in FIG. 2A. Transconductor stage 110 is represented by the impedance it presents to output matching network 115 at a transconductor stage output node 205 for transconductor stage 110. This transconductor stage impedance includes an output capacitance Cout and an output resistance Rout. Output matching network 115 includes an inductor L1 having a first terminal coupled to a transconductor stage output node 205. The inductance of inductor L1 is selected so that L1 and Cout form a series LC tank circuit 220 that is resonant at the midrange frequency f0 (note that frequency f0 lies between the lower frequency f1 and the higher frequency f2 and may thus be denoted as being "midrange" herein). Inductor L1 includes a second terminal coupled to an internal node 225 of output matching network 115. Internal node 225 and the second terminal of inductor L1 are the same electrical node.

A first coil L2 of an output transformer T couples between internal node 225 and a reference voltage node such as a power supply node for a power supply voltage Vdd. A second coil L3 of the output transformer T couples through a DC-blocking capacitor C3 to an amplifier output node 230 of wideband LNA 100. Second coil L3 is shown as coupling to a node for the power supply voltage Vdd but it may also couple to another fixed voltage node such as ground. Similarly, the reference voltage node coupled to the first coil L2 may be a ground node in alternative implementations. DC-blocking capacitor C3 is also denoted herein as a second capacitor. A capacitor C2 (e.g, a fixed or a variable capacitor C2) is coupled in parallel with first coil L2 between internal node 225 and the reference voltage node such as the power supply node for the power supply voltage Vdd to form a parallel LC tank circuit 215. DC-blocking capacitor C3 may also be a variable capacitor in alternative implementations. Capacitor C2 is also denoted herein as a first capacitor. The capacitance of capacitor C2 and the inductance of first coil L2 are selected so that parallel LC tank circuit 215 is resonant at the midrange frequency f0. A resistor R2 (e.g., a fixed or a variable resistor R2) may couple in parallel with capacitor C2.

Figure 2B:
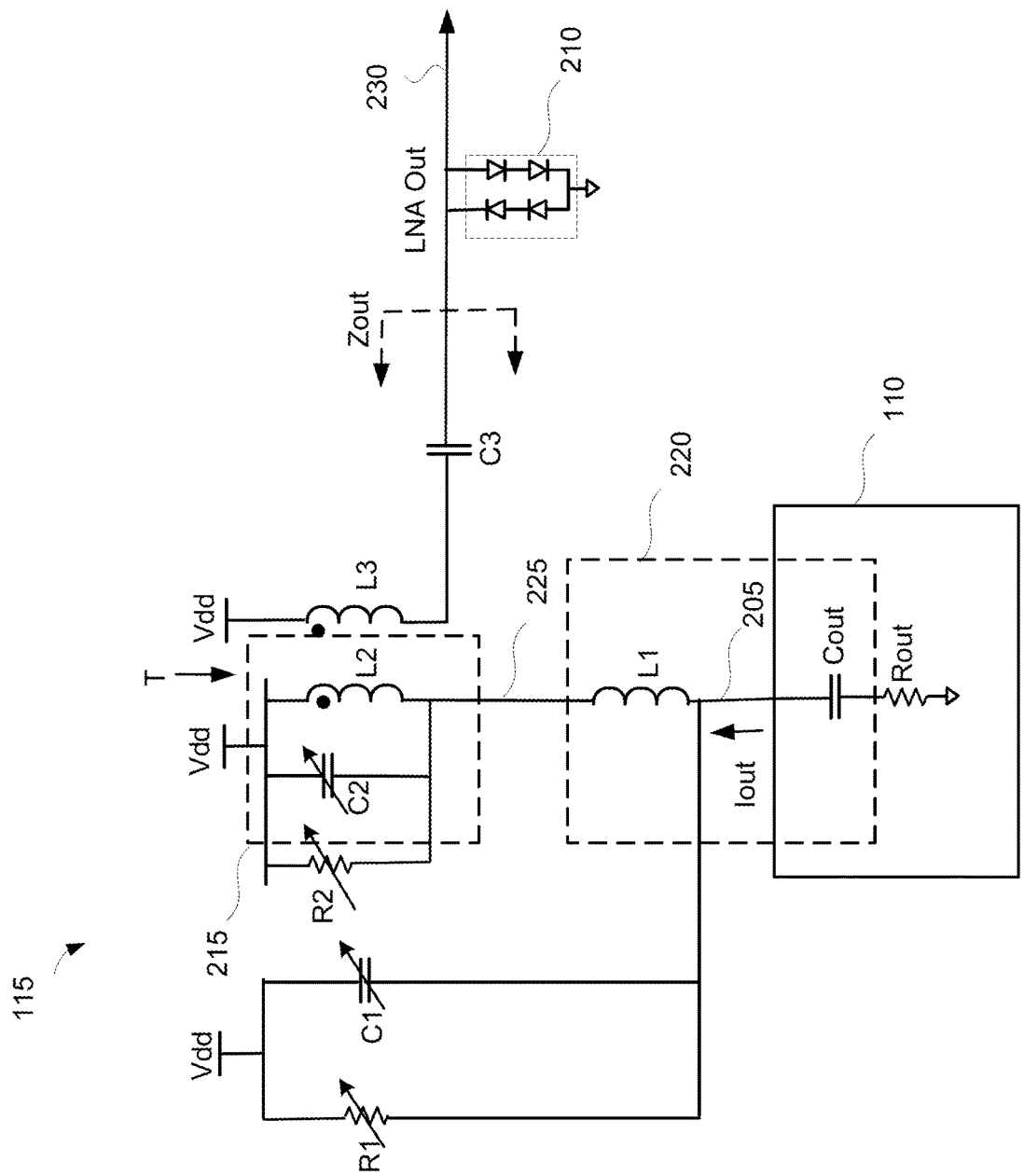
FIG. 2B is a circuit diagram of an alternative implementation of the output matching network of FIG. 2A in accordance with an aspect of the disclosure.

An alternative implementation for output matching network 115 is shown in FIG. 2B. Output transformer T, capacitor C2, resistor R2, inductor L1, DC-blocking capacitor C3, and transconductor stage 110 are arranged as discussed for FIG. 2A. In the implementation of FIG. 2B, output node 230 may be protected by a plurality of electrostatic discharge diodes 210. In addition, a fixed or a variable resistor R1 may be coupled in parallel with a fixed or a variable capacitor C1 between the power supply node and transconductor stage output node 205. By a tuning of the resistance of resistors R1 and R2, wideband performance of LNA 100 is enhanced for low gain states. Capacitor C1 is optional but through a proper tuning of its capacitance, LNA 100 may switch between wideband and narrowband modes of operation. Capacitor C1 is also denoted herein as a second capacitor.

Figure 3A:
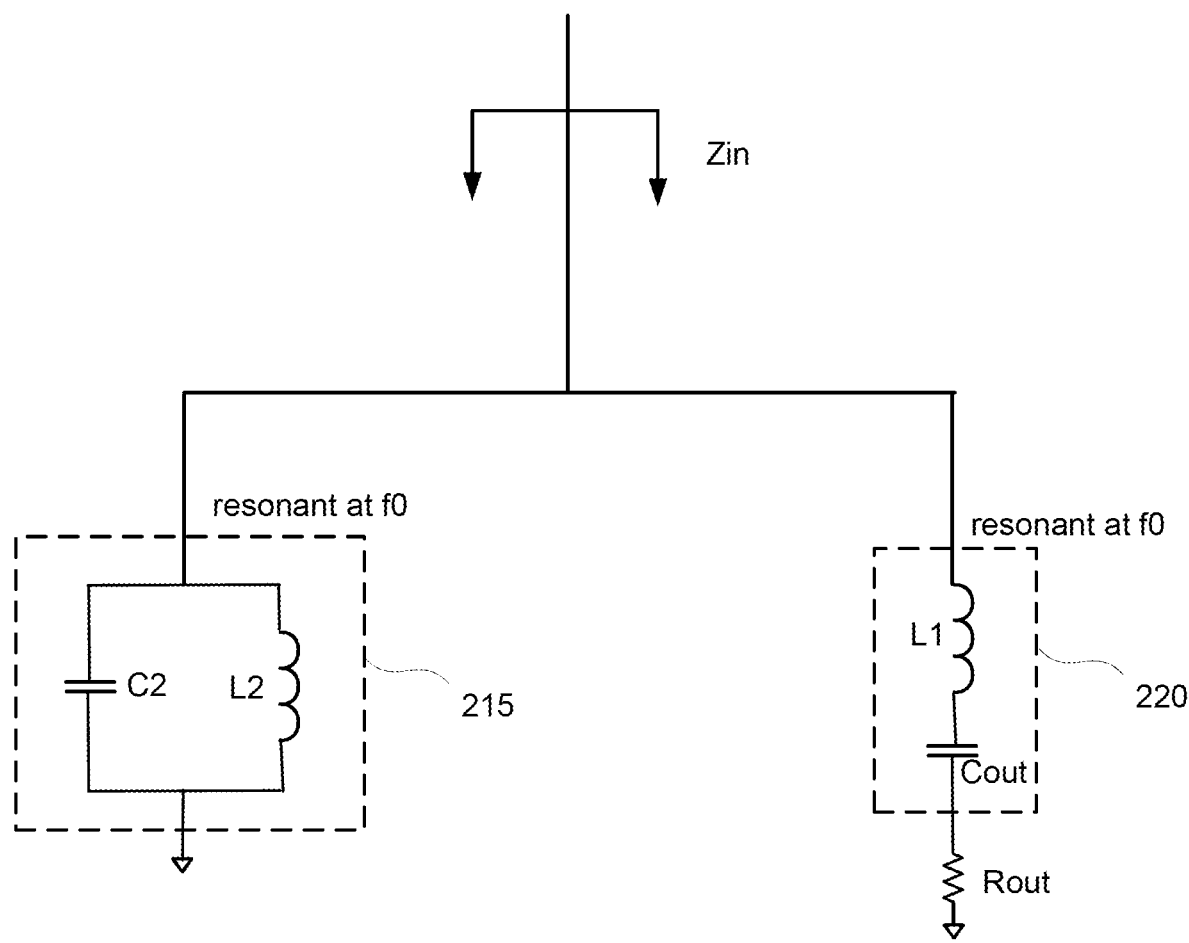
FIG. 3A is a simplified circuit diagram of an output matching network in accordance with an aspect of the disclosure.
Figure 3B:
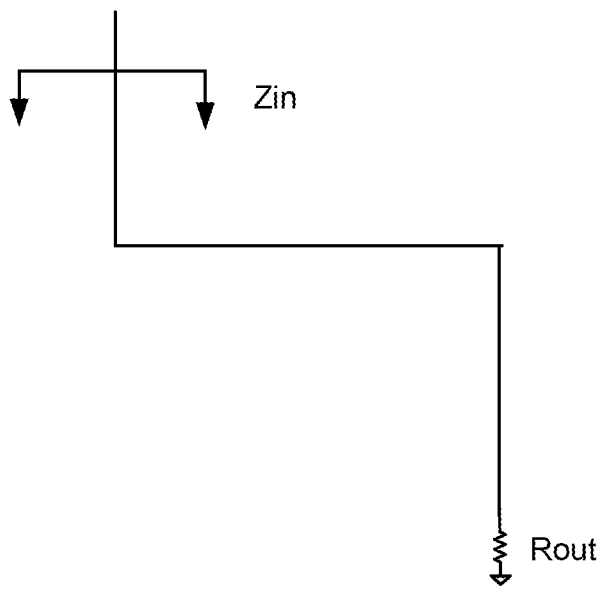
FIG. 3B is a simplified circuit diagram of an output matching network when resonant at a midrange frequency in accordance with an aspect of the disclosure.

The output impedance Zout of output matching network 115 will now be discussed in more detail. With respect to the output impedance Zout, parallel LC tank circuit 215 and series LC tank circuit 220 are shown again in FIG. 3A. It is equivalent to consider the output impedance Zout as also being an input impedance Zin. In this view, second coil L3 and DC-blocking capacitor C3 are omitted for illustration clarity. In that regard, DC-blocking capacitor C3 has a relatively large capacitance and is thus effectively a short circuit at the signal frequencies of interest. Being resonant at midrange frequency f0, parallel LC tank circuit 215 presents an open circuit to input impedance Zin. But the resonance of series LC tank circuit 220 presents a short circuit to input impedance Zin at the midrange frequency f0. The input impedance Zin thus devolves to substantially equal the output resistance Rout of transconductor stage 110 (FIG. 1) at the midrange frequency f0 as shown in FIG. 3B. The output resistance Rout of transconductor stage 110 is typically around 30Ω. A reflection coefficient S11 (or equivalently S22) for the input impedance Zin is thus approximately equal to −10 dB.

As the frequency of the input signal to LNA 100 increases above midrange frequency f0 towards the upper frequency f2, the series LC tank circuit 220 becomes inductive because $\omega L \gg 1/\omega C$, where $\omega$ is the angular frequency ($2\pi f$), L is the inductance of inductor L1, and C is the output capacitance of the transconductor stage 110. In contrast, the parallel LC tank circuit 215 becomes capacitive as the input signal frequency increases. As shown in FIG. 4A, the parallel LC tank circuit 215 thus effectively presents only the capacitance of capacitor C2 to the input impedance Zin of output matching network 115. Similarly, the series LC tank circuit 220 effectively presents only the inductance of inductor L1 to the input impedance Zin. It can be shown that the impedance of the inductor L1 in series with the resistance Rout is approximately equivalent to the same inductor in parallel with a resistance Rout*Q, where Q is the loaded quality factor of the series LC tank circuit 220. The input impedance Zin of output matching network 115 may thus be considered to be a parallel combination of capacitor C2, inductor L1, and a resistance Q*Rout as the input signal frequency is increased towards upper frequency f2 as shown in FIG. 4B. At the upper frequency f2, the inductor L1 and capacitor C2 function as a second parallel LC tank circuit that is resonant at frequency f2 so as to present an open circuit to the input impedance Zin. The input impedance Zin of output matching network 115 thus becomes equal to Q*Rout as shown in FIG. 4C. This multiplication of Rout with the quality factor Q is advantageous in that a typical value of Rout is 30 Ohms as discussed earlier. A typical value of the quality factor Q is such that Q*30 may approximately equal 50 Ohms, which is an even better output impedance matching than achieved at the midrange frequency f0 (assuming that that the output impedance of wideband LNA 100 should be matched to 50 Ohms).

As the frequency of the input signal to wideband LNA 100 drops below the midrange frequency f0 towards the lower frequency f1, a complementary resonant behavior occurs as discussed with regard to the upper frequency f2. In particular, the impedance of the parallel LC tank circuit 215 becomes inductive whereas the impedance of the series LC tank circuit 220 becomes capacitive as the input signal frequency drops towards the lower frequency f1. As shown in FIG. 5A, the parallel LC tank circuit 215 thus effectively presents only the inductance of coil L2 to the input impedance Zin of output matching network 115. Similarly, the series LC tank circuit 220 effectively presents only the output capacitance Cout of the transconductor stage 110 to the input impedance Zin. It can be shown that the impedance of the output capacitance Cout in series with a resistance Rout is approximately equivalent to the same output capacitance Cout in parallel with a resistance Rout*Q, where Q is the loaded quality factor of the series LC tank circuit 220. The input impedance Zin of output matching network 115 may thus be considered to be a parallel combination of the inductance of first coil L2, the output capacitance Cout, and a resistance Q*Rout as the input signal frequency is decreased towards lower frequency f1 as shown in FIG. 5B. At the lower frequency f1, the first coil L2 and output capacitance Cout function as a third parallel LC tank circuit that is resonant at frequency f1 so as to present an open circuit to the input impedance Zin. The input impedance Zin of output matching network 115 at the lower frequency f1 thus becomes equal to Q*Rout as shown in FIG. 5C. This multiplication of Rout with the quality factor Q is advantageous in that a typical value of Rout is 30 Ohms as discussed earlier. A typical value of the quality factor Q is such that Q*30 approximately equals 50 Ohms, which is an even better output impedance matching than achieved at the midrange frequency f0 (again assuming that that the output impedance of wideband LNA 100 should be matched to 50 Ohms).

As will be explained further herein, transconductor stage 110 may be implemented with or without cascode transistors. In cascode transistor implementations, output node 205 of transconductor stage 110 couples to cascode transistor branches of transconductor stage 110. Transconductor stage output node 205 is thus a relatively high impedance node. In an implementation in which the output transformer couples directly to transconductor stage output node 205, the output transformer may be configured to step down in impedance. For example, if the impedance of amplifier output node 230 of wideband LNA 100 is to be matched to 50 Ohms, an output transformer may thus step down in impedance from a transconductor stage output node to an amplifier output node. In contrast, internal node 225 of output matching network 115 may be a low impedance node because this impedance loads series LC tank circuit 220. By keeping the impedance of internal node 225 relatively low, series LC tank circuit 220 may have a relatively high loaded quality factor Q. Since internal node 225 is a relatively low impedance node, output transformer T steps down in impedance from amplifier output node 230 to internal node 225. The inductance of first coil L2 is thus higher than the inductance of second coil L3 in output transformer T.

Figure 6:
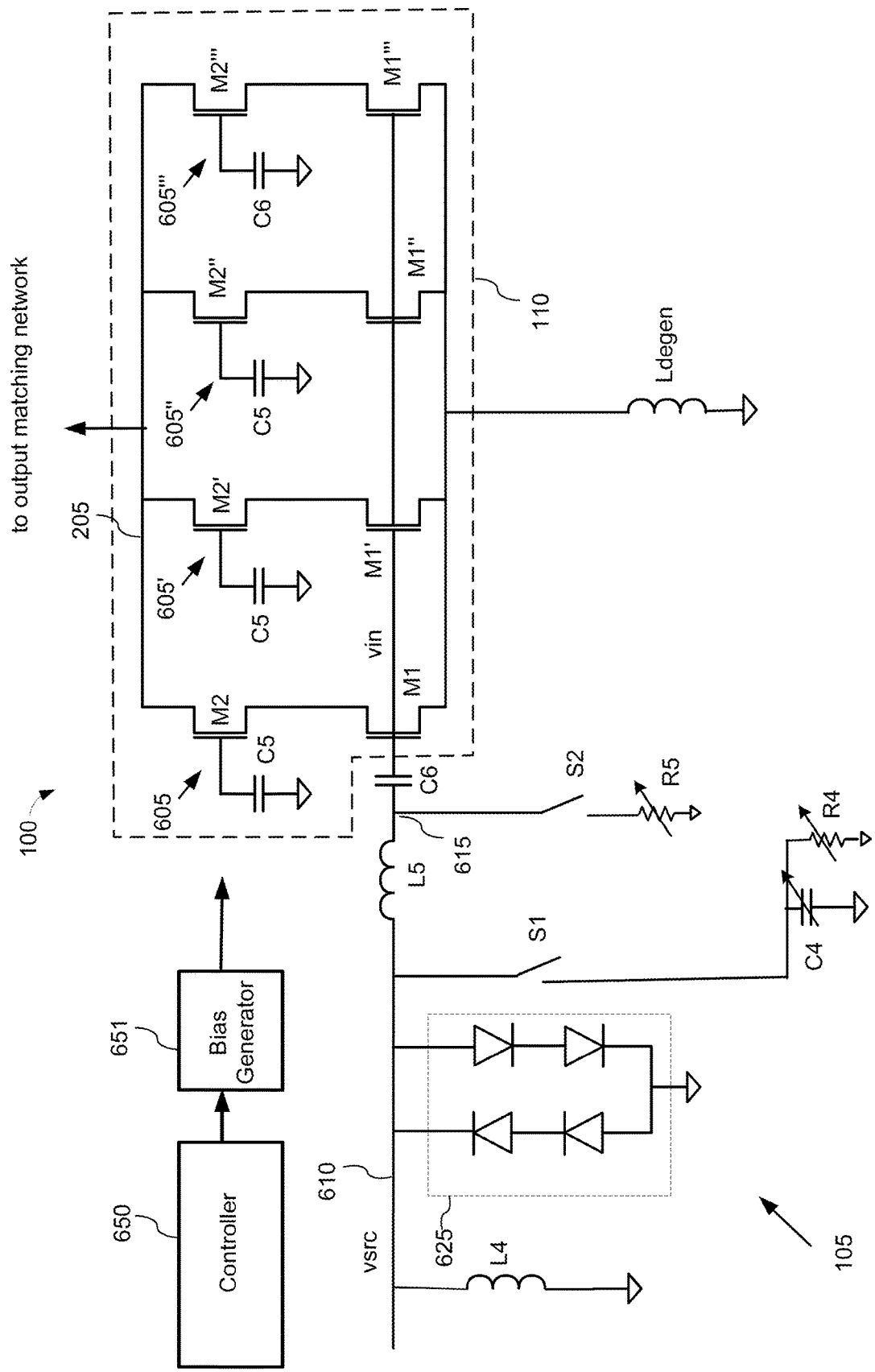
FIG. 6 is a circuit diagram of a transconductor stage and an input matching network of a wideband amplifier in accordance with an aspect of the disclosure.

An example transconductor stage 110 and input matching network 105 for wideband LNA 100 is shown in more detail in FIG. 6. While a particular example of the transcondutor stage 110 is depicted, the dotted line box around the transconductor stage 110 is provided further to indicate there may be a variety of possible transconductor stages possible that may be operable in conjunction with the output matching network described above to provide a wideband operation. Likewise, while a particular input matching network 105 is depicted in FIG. 6, other input matching network implementations may be possible and may be operable in conjunction with the output matching network described above to provide a wideband operation. To allow for gain adaptation, transconductor stage 110 includes several selectable branches or segments. Each branch includes its own transconductor transistor and a cascode transistor. For example, a first branch 605 includes a first transconductor transistor M1 having a drain connected to a source of a first cascode transistor M2. A second branch 605' has an analogous arrangement of a second transconductor transistor M1' and a second cascode transistor M2'. Similarly, a third branch 605" includes a third transconductor transistor M1" and a third cascode transistor M2". Finally, a fourth branch 605'" includes a fourth transconductor transistor M1'" and a fourth cascode transistor M2'". The gates of the transconductor transistors M1, M1', M1", and M1'" form an input node for transconductor stage 110. It will be appreciated that each cascode transistor may be replaced by two or more cascode transistors in alternative implementations. In alternative implementations, each selectable branch or segment would include only a transconductor transistor. In such implementations, transconductor stage output node 205 would couple to the drains of the transconductor transistors in the selected branches. In transconductor stage 110, the transconductor and cascode transistors are all n-type metal-oxide semiconductor (NMOS) transistors but it will be appreciated that transconductor stage 110 is readily converted to a p-type metal-oxide semiconductor (PMOS) implementation in which the transconductor and cascode transistors are all PMOS transistors or a mixture of NMOS and PMOS transistors.

To activate a branch, a controller 650 controls a gate bias of the corresponding cascode transistor with a bias voltage as generated by a bias generator 651 so that the corresponding cascode transistor is conducting. For example, just one branch may be active in a low-gain state for transconductor stage 110. Similarly, bias generator 651 biases the gates of the cascode transistors in the inactive branches so that their cascode transistors are non-conducting. For example, bias generator 651 may ground the gates of the cascode transistors in the inactive branches in an NMOS implementation to prevent them from contributing to the amplification of the LNA input signal voltage vrsc. The gate of each cascode transistor couples to ground through a corresponding capacitor C5 so that each cascode transistor gate is AC grounded. In a PMOS implementation, the inactive branches would have the gates of their cascode transistors charged to a power supply voltage as opposed to being grounded in an NMOS implementation.

The input signal voltage yin from input matching network 105 drives the gate of the transconductor transistor in each of the active branches so that each active branch conducts a corresponding current depending upon the transconductance of the transconductor transistor. For example, suppose that branch 605 is active. First transconductor transistor M1 will then conduct a current that passes through cascode transistor M2 to form the output current Tout at transconductor stage output node 205 that drives the output matching network 115. More generally, each active branch contributes to the output current Tout.

To provide wideband matching to a desired input impedance (e.g., 50 Ω), input matching network 105 includes an inductor L4 that couples between an amplifier input node 610 for the input signal voltage vsrc and a fixed voltage reference such as ground. ESD diodes 625 may be present to provide electrostatic discharge protection for amplifier input node 610. An inductor L5 couples between amplifier input node 610 and the gates of the transconductor transistors through a DC-blocking capacitor C6. The sources of the transconductor transistors couple to ground through a degeneration inductor Ldegen. Inductor L4 may also be denoted herein as a first inductor (or as a second inductor) whereas inductor L5 may be denoted as a second inductor (or as a third inductor). Inductor L1 may also be denoted herein as a third inductor.

In some implementations, some (or all) of inductors L4, L5, and Ldgen may be magnetically coupled to each other.

Figure 7:
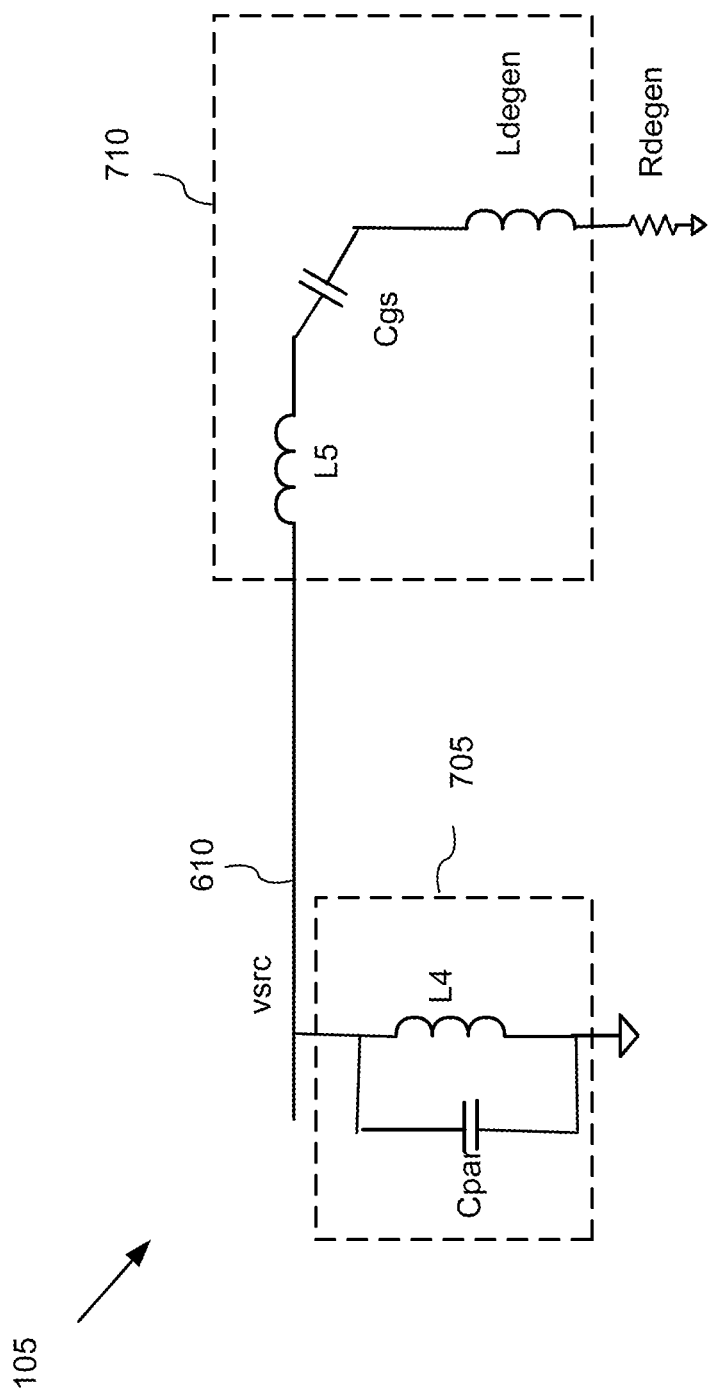
FIG. 7 is a simplified circuit diagram of the input matching network of FIG. 6 in accordance with an aspect of the disclosure.

It will now be shown that input matching network 105 also includes a parallel LC tank circuit that is arranged in parallel with a series LC tank circuit so as to be resonant at the lower frequency f1, the midrange frequency f0, and the higher frequency f2. In particular, input matching network 105 is shown in more simplified schematic view of FIG. 7. The amplifier input node 610 is not only loaded by inductor L4 but also by a parasitic capacitance Cpar such as caused by integrated circuit package routing, ESD diodes 625 (FIG. 6), and so on. Due to their coupling in parallel between ground and amplifier input node 610, parasitic capacitance Cpar and inductor L4 form a parallel LC tank circuit 705. Inductor L5 couples through the parasitic gate-to-source capacitance Cgs of the transconductor transistors to the degeneration inductor Ldegen. The degeneration from degeneration inductor Ldegen introduces an effective (non-physical) resistance Rdegen. The serial coupling of inductor L5, parasitic capacitance Cgs, and degeneration inductor Ldegen between the amplifier input node 610 and resistance Rdegen forms a series LC tank circuit 710. Through a proper selection of inductor L4, L5, and Ldegen, parallel LC tank circuit 705 and series LC tank circuit 710 function analogously as discussed with regard to parallel LC tank circuit 215 and series LC tank circuit 220 to produce resonance substantially at the lower frequency f1, the midrange frequency f0, and the higher frequency f2. In this fashion, wideband LNA 100 has wideband matching both at its amplifier input node 610 and at its amplifier output node 230.

Referring again to FIG. 6, input matching network 105 may include a capacitor C4 (e.g., a variable capacitor) having a first terminal coupled to ground and a second terminal coupled to amplifier input node 610 through a switch S1. With switch S1 closed, the capacitance of capacitor C4 adds to the parasitic capacitance Cpar. Should the parasitic capacitance Cpar be insufficient for the desired resonance at the lower frequency f1, midrange frequency f0, and higher frequency f2, capacitor C4 may be appropriately tuned and switch S1 closed accordingly. The use of capacitor C4 is also advantageous as it lowers the dependence of the resonances to the process variations of the parasitic capacitance Cpar. In addition, a resistor R5 (e.g., a variable resistor) may load a node 615 between inductor L5 and DC-blocking capacitor C6 when a switch S2 is closed. A resistor R4 (e.g., a variable resistor) couples in parallel with capacitor C4 between switch S1 and ground. Resistors R4 and R5 and also capacitor C4 may be used in low gain states to add input attenuation linearity while maintaining the wideband matching. All the components of input matching network 105, transconductor stage 110, and output matching network may be integrated onto a single integrated circuit 120 as shown in FIG. 1. However, in some implementations, inductor L4 may be a discrete component to ease the layout of inductors L1, output transformer T, and degeneration inductor Ldegen in integrated circuit 120.

It will be appreciated that wideband amplifier including output matching network input 115 may be implemented with alternative input matching networks in lieu of matching network 105. Similarly, transconductor stage 110 is merely exemplary and may be replaced by alternative transconductor stages in alternative implementations. In addition, the integrated devices discussed herein may also be implemented as discrete devices.

Figure 8:
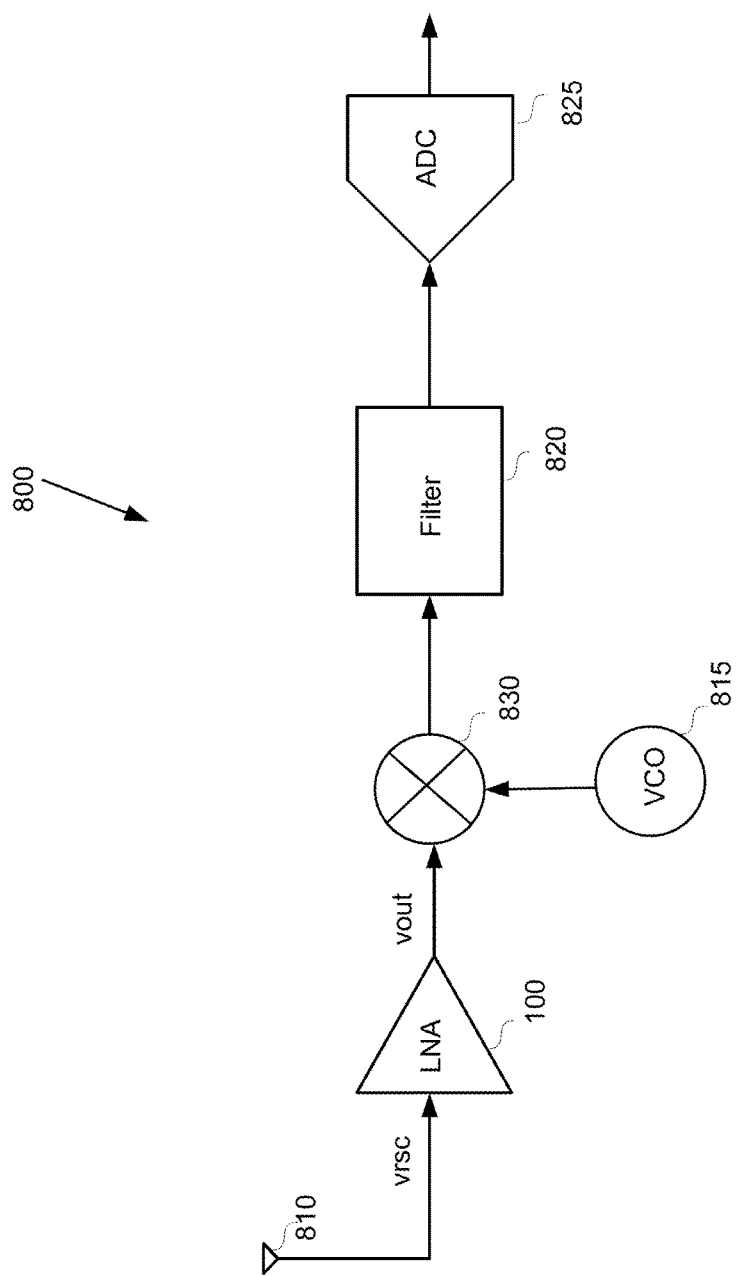
FIG. 8 illustrates a receiver incorporating a wideband low-noise amplifier in accordance with an aspect of the disclosure.

A wideband LNA 100 as disclosed herein may be used in any suitable receiver architecture such as for mobile devices, laptops, base stations, small cells, internet of thing devices and so on. An example cellular telephone receiver 800 (which may also be applicable to other suitable receiver architectures such as WLAN or other WWAN systems) is shown in FIG. 8. Wideband LNA 100 includes an input matching network, a transconductor stage, and an output matching network arranged as disclosed herein. LNA 100 amplifies an input voltage signal vrsc such as produced by a received RF signal from an antenna 810 (or antennas). An output voltage signal vout from LNA 100 is mixed in a mixer 830 with a local oscillator signal such as from a voltage-controlled oscillator (VCO) 815 to produce an analog baseband signal that is filtered by a filter 820 before being digitized by an analog-to-digital converter (ADC) 825 to form a digital baseband signal. Filter 820 may instead be implemented in the digital domain downstream from ADC 825 as known in the receiver arts.

Figure 9:
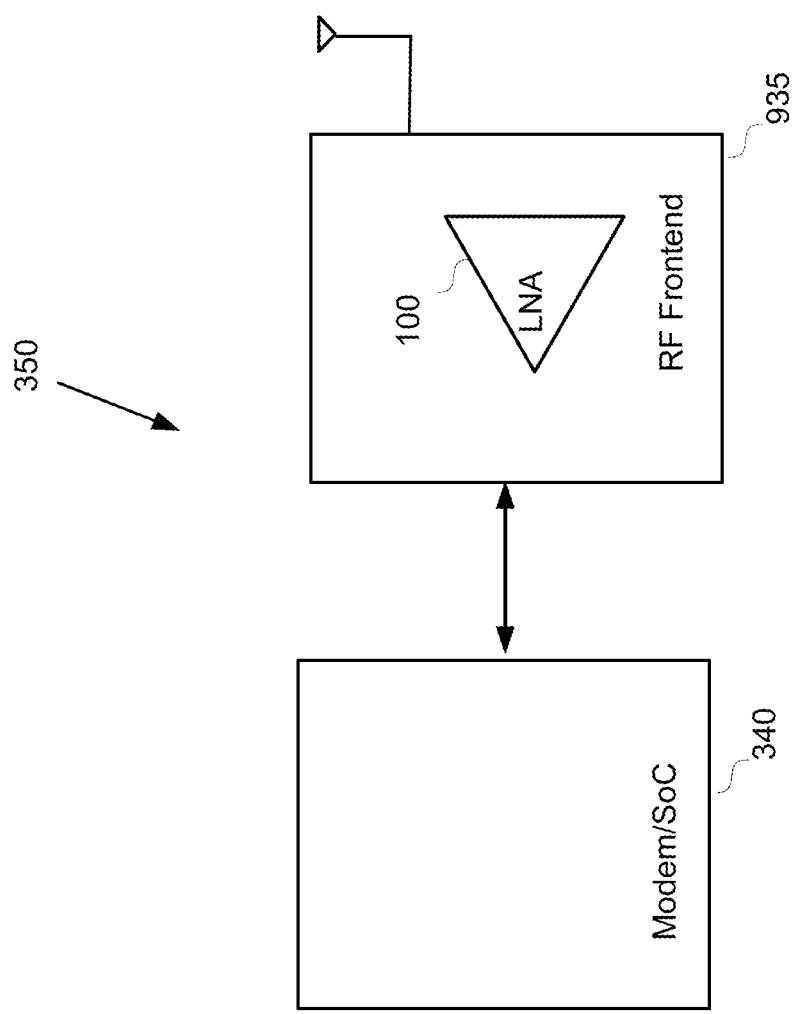
FIG. 9 illustrates a cellular telephone incorporating a wideband low-noise amplifier in accordance with an aspect of the disclosure.

A receiver with an LNA 100 as disclosed herein may be integrated into a transceiver RF frontend circuit 935 within a cellular telephone 950 as shown in FIG. 9. Transceiver RF frontend circuit 935 converts a digital baseband signal from a modem 940 into an RF signal for transmission to a remote network node such as a base station (not illustrated). Transceiver RF frontend circuit 935 also functions to convert a received RF signal into a digital baseband signal for modem 940. In some implementations, modem 940 may also be integrated within a system-on-a-chip (SoC). It will be appreciated that an LNA as disclosed herein may be included within an RF frontend integrated circuit that is distinct from a transceiver integrated circuit.

A method of matching the impedance of a transconductor stage output node in an LNA to an output impedance of the LNA will now be discussed with reference to the flowchart of FIG. 10. The method includes an act 1000 of transconducting a first input voltage signal through a transconductor stage having an output capacitance to form a first output current signal at an output node of the transconductor stage. Operation of transconductor stage 110 is an example of act 1000. In addition, the method includes an act 1005 of driving the first output current signal into a parallel combination of a series inductor-capacitor tank circuit and a first parallel inductor-capacitor tank circuit, wherein the series inductor-capacitor tank circuit includes the output capacitance and an inductor coupled between a first coil of an output transformer and an output node of the transconductor stage and the first parallel inductor-capacitor tank circuit includes a capacitor arranged in parallel with the first coil of the output transformer, to cause both the series inductor-capacitor tank circuit and the first parallel inductor-capacitor tank circuit to be resonant at a midrange frequency to match an impedance of an amplifier output node at the midrange frequency to an output resistance of the transconductor stage, wherein the midrange frequency is greater than a first frequency and less than a second frequency. The operation of the series LC tank circuit 220 at the midrange frequency f0 is an example of act 1005. As discussed with regard to FIG. 3B, the driving of the first output current signal into the parallel combination of the series inductor-capacitor tank circuit and the first parallel inductor-capacitor tank causes the series inductor-capacitor tank circuit to function as a short circuit.

The method may be extended to include the resonance at the first frequency f1 as discussed with regard to FIGS. 5A through 5C. For example, the method may include an act of transconducting a second input voltage signal through the transconductor stage to form a second output current signal and an act of driving the second output current signal into the parallel combination of the series inductor-capacitor tank circuit and the first parallel inductor-capacitor tank circuit to cause a combination of the first coil and the output capacitance to function as a second parallel inductor-capacitor tank circuit that is resonant at the first frequency to match an impedance of the amplifier output node at the first frequency to a product of the output resistance of the transconductor stage and a quality factor of the series inductor-capacitor tank circuit. The driving of the second output current signal into the parallel combination of the series inductor-capacitor tank circuit and the first parallel inductor-capacitor tank circuit is shown in FIG. 5A. The second parallel inductor-capacitor tank circuit is shown in FIG. 5B. The second parallel inductor-capacitor tank circuit then functions as an open circuit when resonant at the first frequency as shown in FIG. 5C.

Finally, the method may be extended to include the resonance at the second frequency f2 as discussed with regard to FIGS. 4A through 4C. The method may include an act of transconducting a third input voltage signal through the transconductor stage to form a third output current signal and an act of driving the third output current signal into the parallel combination of the series inductor-capacitor tank circuit and the first parallel inductor-capacitor tank circuit to cause a combination of the capacitor and the inductor to function as a third parallel inductor-capacitor tank circuit that is resonant at the second frequency to match an impedance of the amplifier output node at the second frequency to a product of the output resistance of the transconductor stage and the quality factor of the series inductor-capacitor tank circuit. The driving of the third output current into the parallel combination of the series inductor-capacitor tank circuit and the first parallel inductor-capacitor tank circuit is shown in FIG. 4A. The third parallel inductor-capacitor tank circuit that is resonant at the second frequency is shown in FIG. 4B. As shown in FIG. 4C, the third parallel inductor-capacitor tank circuit than functions as an open circuit when resonant at the second frequency.

The disclosure will now be summarized through a series of clauses:

Clause 1. An amplifier, comprising:
a transconductor stage including a transconductor stage output node, the transconductor stage being configured to amplify an input signal; and
an output matching network including:
a first inductor having a first terminal coupled to the transconductor stage output node;
an output transformer including a first coil electromagnetically coupled to a second coil, the first coil being coupled between a reference voltage node and a second terminal of the first inductor, the second coil being coupled to an amplifier output node;
and a first capacitor coupled between the second terminal of the first inductor and the reference voltage node.

Clause 2. The amplifier of clause 1, wherein the first capacitor is a variable capacitor, and wherein the reference voltage node is a power supply node for a power supply voltage.

Clause 3. The amplifier of any of clauses 1-2, wherein the output matching network further includes a resistor coupled between the second terminal of the first inductor and the reference voltage node.

Clause 4. The amplifier of clause 3, wherein the resistor is a variable resistor.

Clause 5. The amplifier of clause 1, wherein the output matching network further includes:
 a second capacitor coupled between the transconductor stage output node and the reference voltage node.

Clause 6. The amplifier of clause 5, wherein the output matching network further includes:
 a resistor coupled between the transconductor stage output node and the reference voltage node.

Clause 7. The amplifier of clause 6, wherein the second capacitor is a variable capacitor and the resistor is a variable resistor.

Clause 8. The amplifier of any of clauses 1-7, wherein an inductance of the first coil is greater than an inductance of the second coil.

Clause 9. The amplifier of any of clauses 1-8, wherein the transconductor stage comprises:
 a first transconductor transistor, wherein an input node of the transconductor stage is formed by a gate of the first transconductor transistor; and
 a first cascode transistor having a source coupled to a drain of the first transconductor transistor and having a drain coupled to the transconductor stage output node.

Clause 10. The amplifier of clause 9, wherein the transconductor stage further comprises:
 a second transconductor transistor, wherein the input node of the transconductor stage is further formed by a gate of the second transconductor transistor, and
 a second cascode transistor having a source coupled to a drain of the second transconductor transistor and having a drain coupled to the transconductor stage output node.

Clause 11. The amplifier of any of clauses 9-10, further comprising:
 a degeneration inductor coupled between a source of the first transconductor transistor and ground.

Clause 12. The amplifier of clause 10, further comprising:
 a bias generator configured to generate a first gate bias voltage for a gate of the first cascode transistor and configured to generate a second gate voltage for a gate of the second cascode transistor; and
 a controller configured to control the bias generator to adjust the first gate bias voltage and the second gate bias voltage to control a gain of the transconductor stage.

Clause 13. The amplifier of clause 1, wherein the output matching network further comprises a second capacitor coupled between second coil and the amplifier output node.

Clause 14. The amplifier of any of clauses 1-13, further comprising:
 an input matching network coupled between an amplifier input node and an input node of the transconductor stage.

Clause 15. The amplifier of clause 14, wherein the input matching network includes a second inductor coupled between ground and the amplifier input node; a capacitor having a first terminal and a second terminal, wherein the second terminal of the capacitor is coupled to the input node of the transconductor stage; and a third inductor coupled between the amplifier input node and the first terminal of the capacitor.

Clause 16. The amplifier of any of clauses 1-15, wherein the amplifier comprises a low-noise amplifier integrated within a receiver comprising:
 a mixer coupled to the amplifier output node;
 an analog-to-digital converter; and
 a filter coupled between an output node of the mixer and an input node to the analog-to-digital converter.

Clause 17. The amplifier of any of clauses 1-16, further comprising:
 a plurality of electrostatic discharge diodes coupled to the amplifier output node.

Clause 18. The amplifier of clauses 1-16, further comprising:
 a plurality of electrostatic discharge diodes coupled to an amplifier input node of the amplifier.

Clause 19. An amplification method, comprising:
 transconducting a first input voltage signal through a transconductor stage having an output capacitance to form a first output current signal; and
 driving the first output current signal into a parallel combination of a series inductor-capacitor tank circuit and a first parallel inductor-capacitor tank circuit, wherein the series inductor-capacitor tank circuit includes the output capacitance and an inductor coupled between a first coil of an output transformer and an output node of the transconductor stage and the first parallel inductor-capacitor tank circuit includes a capacitor arranged in parallel with the first coil of the output transformer, to cause both the series inductor-capacitor tank circuit and the first parallel inductor-capacitor tank circuit to be resonant at a midrange frequency to match an impedance of an amplifier output node at the midrange frequency to an output resistance of the transconductor stage, wherein the midrange frequency is greater than a first frequency and less than a second frequency.

Clause 20. The method of clause 19, wherein driving the first output current signal into the parallel combination of the series inductor-capacitor tank circuit and the first parallel inductor-capacitor tank circuit further comprises:
 causing the series inductor-capacitor tank circuit to function as a short circuit.

Clause 21. The method of any of clauses 19-20, further comprising:
 transconducting a second input voltage signal through the transconductor stage to form a second output current signal; and
 driving the second output current signal into the parallel combination of the series inductor-capacitor tank circuit and the first parallel inductor-capacitor tank circuit to cause a combination of the first coil and the output capacitance to function as a second parallel inductor-capacitor tank circuit that is resonant at the first frequency to match an impedance of the amplifier output node at the first frequency to a product of the output resistance of the transconductor stage and a quality factor of the series inductor-capacitor tank circuit.

Clause 22. The method of clause 21, wherein driving the second output current signal into the parallel combination of the series inductor-capacitor tank circuit and the first parallel inductor-capacitor tank circuit further comprises:
 causing the second parallel inductor-capacitor tank circuit to function as an open circuit.

Clause 23. The method of any of clauses 19-22, further comprising:
 transconducting a third input voltage signal through the transconductor stage to form a third output current signal; and
 driving the third output current signal into the parallel combination of the series inductor-capacitor tank circuit and the first parallel inductor-capacitor tank circuit to cause a combination of the capacitor and the inductor to function as a third parallel inductor-capacitor tank circuit that is resonant at the second frequency to match an impedance of the amplifier output node at the second frequency to a product of the output resistance of the transconductor stage and the quality factor of the series inductor-capacitor tank circuit.

Clause 24. The method of clause 23, wherein driving the third output current signal into the parallel combination of the series inductor-capacitor tank circuit and the first parallel inductor-capacitor tank circuit further comprises:
causing the third parallel inductor-capacitor tank circuit to function as an open circuit.

Clause 25. An amplifier, comprising:
a transconductor stage including a first transconductor transistor; and
an input matching network including a first inductor coupled between an amplifier input node and ground, a second inductor having a first terminal coupled to the amplifier input node, a capacitor coupled between a second terminal of the second inductor and a gate of the first transconductor transistor, and a degeneration inductor coupled to a source of the first transconductor transistor, wherein a combination of an inductance of the second inductor, an inductance of the degeneration inductor, and a parasitic gate-to-source capacitance of the first transconductor transistor is configured to form a series inductor-capacitor (LC) tank circuit that is resonant at a first frequency, and wherein a combination of a capacitance of the amplifier input node and an inductance of the first inductor is configured to form a parallel LC tank circuit that is resonant at the first frequency.

Clause 26. The amplifier of clause 25, wherein the input matching network further comprises:
a first switch;
a variable capacitor coupled through the first switch to the amplifier input node; and
a first variable resistor coupled through the first switch to the amplifier input node.

Clause 27. The amplifier of clause 26, wherein the input matching network further comprises:
a second switch; and
a second variable resistor coupled through the second switch to the second terminal of the second inductor.

Clause 28. The amplifier of any of clauses 25-27, wherein the transconductor stage is included in an integrated circuit, and wherein the first inductor, the capacitor, and degeneration inductor are also included in the integrated circuit.

Clause 29. The amplifier of any of clauses 25-27, wherein the transconductor stage is included in an integrated circuit, and wherein the first inductor is a discrete component separate from the integrated circuit.

Clause 30. The amplifier of any of clauses 25-29, wherein the transconductor stage further includes:
a transconductor stage output node; and
a first cascode transistor coupled between the first transconductor transistor and the transconductor stage output node.

Clause 31. The amplifier of clause 30, wherein the transconductor stage further includes:
a second transconductor transistor having a gate coupled through the capacitor to the second terminal of the second inductor and having a source coupled to the degeneration inductor; and
a second cascode transistor coupled between the second transconductor transistor and the transconductor stage output node.

Clause 32. The amplifier of clause 31, further comprising:
a controller configured to selectively control a gate voltage of the first cascode transistor and a gate voltage of the second cascode transistor to adjust a gain of the transconductor stage.

Clause 33. The amplifier of clause 30, further comprising:
an amplifier output node; and
an output matching network including an output transformer having a first coil electromagnetically coupled to a second coil, the second coil being coupled to the amplifier output node, the matching output network further including a third inductor coupled between the transconductor stage output node and the first coil.

Clause 34. The amplifier of clause 33, wherein the first coil is coupled between a power supply node for a power supply voltage and the third inductor, and wherein the output matching network further includes a variable capacitor coupled between the power supply node and the third inductor.

Clause 35. An amplifier, comprising:
a transconductor stage including a transconductor stage output node and having an output capacitance; and
an output matching network coupled to the transconductor stage output node and including a parallel inductor-capacitor tank circuit arranged in parallel with a series inductor-capacitor tank circuit that includes the output capacitance of the transconductor stage.

Clause 36. The amplifier of clause 35, further comprising an output transformer, wherein an inductor of the parallel inductor-capacitor tank circuit comprises a first coil of the output transformer.

Clause 37. The amplifier of clause 36, wherein the series inductor-capacitor tank circuit includes an inductor coupled between the transconductor stage output node and the first coil of the output transformer.

Clause 38. The amplifier of clause 36, wherein the output transformer includes a second coil coupled to an output node of the amplifier.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. An amplifier, comprising:
a transconductor stage including a transconductor stage output node, the transconductor stage being configured to amplify an input signal; and
an output matching network including:
a first inductor having a first terminal coupled to the transconductor stage output node;
an output transformer including a first coil electromagnetically coupled to a second coil, the first coil having a first terminal coupled to a reference voltage node and a second terminal coupled to a second terminal of the first inductor, the second coil being coupled to an amplifier output node; and
a first capacitor coupled between the second terminal of the first inductor and the reference voltage node.

2. The amplifier of claim 1, wherein the first capacitor is a variable capacitor, and wherein the reference voltage node is a power supply node for a power supply voltage.

3. The amplifier of claim 1, wherein the output matching network further includes a resistor coupled between the second terminal of the first inductor and the reference voltage node.

4. The amplifier of claim 3, wherein the resistor is a variable resistor.

5. The amplifier of claim 1, wherein the output matching network further includes:
a second capacitor coupled between the transconductor stage output node and the reference voltage node.

6. The amplifier of claim 5, wherein the output matching network further includes:
a resistor coupled between the transconductor stage output node and the reference voltage node.

7. The amplifier of claim 6, wherein the second capacitor is a variable capacitor and the resistor is a variable resistor.

8. The amplifier of claim 1, wherein an inductance of the first coil is greater than an inductance of the second coil.

9. The amplifier of claim 1, wherein the transconductor stage comprises:
a first transconductor transistor, wherein an input node of the transconductor stage is formed by a gate of the first transconductor transistor; and
a first cascode transistor having a source coupled to a drain of the first transconductor transistor and having a drain coupled to the transconductor stage output node.

10. The amplifier of claim 9, wherein the transconductor stage further comprises:
a second transconductor transistor, wherein the input node of the transconductor stage is further formed by a gate of the second transconductor transistor, and
a second cascode transistor having a source coupled to a drain of the second transconductor transistor and having a drain coupled to the transconductor stage output node.

11. The amplifier of claim 9, further comprising:
a degeneration inductor coupled between a source of the first transconductor transistor and ground.

12. The amplifier of claim 10, further comprising:
a bias generator configured to generate a first gate bias voltage for a gate of the first cascode transistor and configured to generate a second gate voltage for a gate of the second cascode transistor; and
a controller configured to control the bias generator to adjust the first gate bias voltage and the second gate bias voltage to control a gain of the transconductor stage.

13. The amplifier of claim 1, wherein the output matching network further comprises a second capacitor coupled between the second coil and the amplifier output node.

14. The amplifier of claim 1, further comprising:
an input matching network coupled between an amplifier input node and an input node of the transconductor stage.

15. The amplifier of claim 14, wherein the input matching network includes a second inductor coupled between ground and the amplifier input node; a capacitor having a first terminal and a second terminal, wherein the second terminal of the capacitor is coupled to the input node of the transconductor stage; and a third inductor coupled between the amplifier input node and the first terminal of the capacitor.

16. The amplifier of claim 1, wherein the amplifier comprises a low-noise amplifier integrated within a receiver comprising:
a mixer coupled to the amplifier output node;
an analog-to-digital converter; and
a filter coupled between an output node of the mixer and an input node to the analog-to-digital converter.

17. The amplifier of claim 1, further comprising:
a plurality of electrostatic discharge diodes coupled to the amplifier output node.

18. The amplifier of claim 1, further comprising:
a plurality of electrostatic discharge diodes coupled to an amplifier input node of the amplifier.

19. An amplification method, comprising:
transconducting a first input voltage signal through a transconductor stage having an output capacitance to form a first output current signal; and
driving the first output current signal into a parallel combination of a series inductor-capacitor tank circuit and a first parallel inductor-capacitor tank circuit, wherein the series inductor-capacitor tank circuit includes the output capacitance and an inductor coupled between a first coil of an output transformer and an output node of the transconductor stage and the first parallel inductor-capacitor tank circuit includes a capacitor arranged in parallel with the first coil of the output transformer, to cause both the series inductor-capacitor tank circuit and the first parallel inductor-capacitor tank circuit to be resonant at a midrange frequency to match an impedance of an amplifier output node at the midrange frequency to an output resistance of the transconductor stage, wherein the midrange frequency is greater than a first frequency and less than a second frequency.

20. The method of claim 19, wherein driving the first output current signal into the parallel combination of the series inductor-capacitor tank circuit and the first parallel inductor-capacitor tank circuit further comprises:
causing the series inductor-capacitor tank circuit to function as a short circuit.

21. The method of claim 19, further comprising:
transconducting a second input voltage signal through the transconductor stage to form a second output current signal; and
driving the second output current signal into the parallel combination of the series inductor-capacitor tank circuit and the first parallel inductor-capacitor tank circuit to cause a combination of the first coil and the output capacitance to function as a second parallel inductor-capacitor tank circuit that is resonant at the first frequency to match an impedance of the amplifier output node at the first frequency to a product of the output resistance of the transconductor stage and a quality factor of the series inductor-capacitor tank circuit.

22. The method of claim 21, wherein driving the second output current signal into the parallel combination of the series inductor-capacitor tank circuit and the first parallel inductor-capacitor tank circuit further comprises:
causing the second parallel inductor-capacitor tank circuit to function as an open circuit.

23. The method of claim 21, further comprising:
transconducting a third input voltage signal through the transconductor stage to form a third output current signal; and
driving the third output current signal into the parallel combination of the series inductor-capacitor tank circuit and the first parallel inductor-capacitor tank circuit to cause a combination of the capacitor and the inductor to function as a third parallel inductor-capacitor tank circuit that is resonant at the second frequency to match an impedance of the amplifier output node at the second frequency to a product of the output resistance of the transconductor stage and the quality factor of the series inductor-capacitor tank circuit.

24. The method of claim 23, wherein driving the third output current signal into the parallel combination of the series inductor-capacitor tank circuit and the first parallel inductor-capacitor tank circuit further comprises:
causing the third parallel inductor-capacitor tank circuit to function as an open circuit.

25. An amplifier, comprising:
a transconductor stage including a first transconductor transistor; and
an input matching network including a first inductor coupled between an amplifier input node and ground, a second inductor having a first terminal coupled to the amplifier input node, a capacitor coupled between a second terminal of the second inductor and a gate of the first transconductor transistor, and a degeneration inductor coupled to a source of the first transconductor transistor, wherein a combination of an inductance of the second inductor, an inductance of the degeneration inductor, and a parasitic gate-to-source capacitance of the first transconductor transistor is configured to form a series inductor-capacitor (LC) tank circuit that is resonant at a first frequency, and wherein a combination of a capacitance of the amplifier input node and an inductance of the first inductor is configured to form a parallel LC tank circuit that is resonant at the first frequency.

26. The amplifier of claim 25, wherein the input matching network further comprises:
a first switch;
a variable capacitor coupled through the first switch to the amplifier input node; and
a first variable resistor coupled through the first switch to the amplifier input node.

27. The amplifier of claim 26, wherein the input matching network further comprises:
a second switch; and
a second variable resistor coupled through the second switch to the second terminal of the second inductor.

28. The amplifier of claim 25, wherein the transconductor stage is included in an integrated circuit, and wherein the first inductor, the capacitor, and degeneration inductor are also included in the integrated circuit.

29. The amplifier of claim 25, wherein the transconductor stage is included in an integrated circuit, and wherein the first inductor is a discrete component separate from the integrated circuit.

30. The amplifier of claim 25, wherein the transconductor stage further includes:
a transconductor stage output node; and
a first cascode transistor coupled between the first transconductor transistor and the transconductor stage output node.

31. The amplifier of claim 30, wherein the transconductor stage further includes:
a second transconductor transistor having a gate coupled through the capacitor to the second terminal of the second inductor and having a source coupled to the degeneration inductor; and a second cascode transistor coupled between the second transconductor transistor and the transconductor stage output node.

32. The amplifier of claim 31, further comprising:
a controller configured to selectively control a gate voltage of the first cascode transistor and a gate voltage of the second cascode transistor to adjust a gain of the transconductor stage.

33. The amplifier of claim 30, further comprising:
an amplifier output node; and
an output matching network including an output transformer having a first coil electromagnetically coupled to a second coil, the second coil being coupled to the amplifier output node, the matching output network further including a third inductor coupled between the transconductor stage output node and the first coil.

34. The amplifier of claim 33, wherein the first coil is coupled between a power supply node for a power supply voltage and the third inductor, and wherein the output matching network further includes a variable capacitor coupled between the power supply node and the third inductor.

35. The amplifier of claim 1, wherein the first inductor and a capacitance of the transconductor stage form a series inductor-capacitor tank circuit, wherein the first coil and the first capacitor form a parallel inductor-capacitor tank circuit, wherein both the series inductor-capacitor tank circuit and the parallel inductor-capacitor tank circuit are configured to be resonant at a midrange frequency, wherein the midrange frequency is greater than a first frequency and less than a second frequency associated with a bandwidth of the amplifier.

36. An amplifier, comprising:
a transconductor stage including a transconductor stage output node, the transconductor stage being configured to amplify an input signal;
an output matching network including:
a first inductor having a first terminal coupled to the transconductor stage output node;
an output transformer including a first coil electromagnetically coupled to a second coil, the first coil being coupled between a reference voltage node and a second terminal of the first inductor, the second coil being coupled to an amplifier output node; and
a first capacitor coupled between the second terminal of the first inductor and the reference voltage node; and
an input matching network coupled between an amplifier input node and an input node of the transconductor stage, wherein the input matching network includes a second inductor coupled between ground and the amplifier input node; a capacitor having a first terminal and a second terminal, wherein the second terminal of the capacitor is coupled to the input node of the transconductor stage; and a third inductor coupled between the amplifier input node and the first terminal of the capacitor.

* * * * *